United States Patent

[11] 3,629,016

[72] Inventors William B. Glendinning Belford; Albert Mark, Toms River, both of N.J.

[21] Appl. No. 16,888
[22] Filed Mar. 5, 1970
[45] Patented Dec. 21, 1971
[73] Assignee The United States of America as represented by the Secretary of the Army

[54] METHOD OF MAKING AN INSULATED GATE FIELD EFFECT DEVICE
8 Claims, 5 Drawing Figs.

[52] U.S. Cl. .......... 148/175, 29/571, 148/1.5, 156/17, 317/235 B
[51] Int. Cl. .......... H01l 7/36, H01l 11/00, H01l 11/14
[50] Field of Search .......... 148/1.5, 174, 175; 317/234, 235; 29/571, 580; 156/17

[56] References Cited

UNITED STATES PATENTS

| | | | |
|---|---|---|---|
| 3,370,995 | 2/1968 | Lowery et al. | 148/175 |
| 3,514,845 | 6/1970 | Legat et al. | 29/571 |
| 3,566,220 | 2/1971 | Post | 317/235 |

*Primary Examiner*—L. Dewayne Rutledge
*Assistant Examiner*—W. G. Saba
*Attorneys*—Harry M. Saragovitz, Edward J. Kelly, Herbert Berl and Roy E. Gordon

ABSTRACT: An insulated gate field effect device is made by a vapor etch and epitaxial refill technique. The vapor etch into a first-type conductivity silicon substrate results in an undercutting between windows such that a cavity is developed completely beneath the insulator separating the window regions. The cavity is then refilled epitaxially with silicon of a second conductivity type; a shallow layer of heavily doped silicon of said first-type conductivity epitaxially regrown in the window area; the gate insulator oxide thinned by etching; and gate, source, and drain contacts made.

INVENTORS,
WILLIAM B. GLENDINNING
& ALBERT MARK
BY: Roy E. Gordon AGENT
Harry M. Saragovitz,
Edward J. Kelly &
Herbert Berl ATTORNEYS.

METHOD OF MAKING AN INSULATED GATE FIELD EFFECT DEVICE

The invention described herein may be manufactured, used and licensed by or for the Government for governmental purposes without the payment to us of any royalty thereon.

BACKGROUND OF THE INVENTION

This invention relates to a method of making a reliable insulated gate transistor device for monolithic integrated electronic circuits.

Insulated gate devices have been made by a diffusion process in which selective regions of a P- or N-type conductivity are formed in a semiconductor surface. In such a case, the region between the P- or N-conductivity regions is the substrate material itself. The difficulty with such devices is that ionic charges, traps, and defects occur and are permanently occluded in the interface between the substrate and the insulator. This, in turn, results in a device with unstable and nonreproducible electrical characteristics.

The general object of this invention is to provide a method of making a reliable insulated gate transistor device for monolithic integrated electronic circuits. A more specific object of the invention is to provide such a method in which device fabrication is accomplished in less than 10.0 minutes of time. A still further object of the invention is to provide an etch-refill method of making an insulated gate device wherein undesirable dopant pileup or depletion effects occurring during thermal oxidation can be eliminated.

DESCRIPTION OF THE DRAWING

The invention can perhaps best be illustrated in its steps by referring to the accompanying drawing wherein.

SUMMARY OF THE INVENTION AND DESCRIPTION OF THE PREFERRED EMBODIMENT

Briefly, an insulated gate field effect transistor according to the invention can be made by a vapor etch and epitaxial refill technique. That is, the vapor etch into a first-type conductivity silicon substrate results in an undercutting between previously formed, insulatably spaced windows such that a cavity is developed completely beneath the insulator separating the window regions. The cavity is then refilled epitaxially with silicon of a second conductivity type; a shallow layer of heavily doped silicon of said first-type conductivity epitaxially regrown in the window area; the gate insulator oxide thinned by etching; and gate, source, and drain contacts made.

Figure 1:
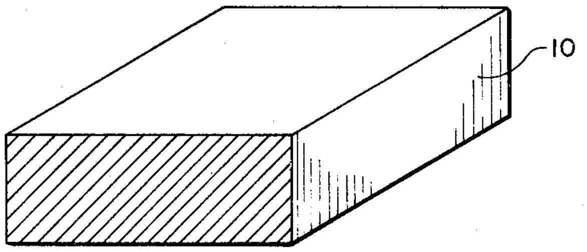
FIGS. 1–5 illustrate the method embodied in the invention.
Figure 2:
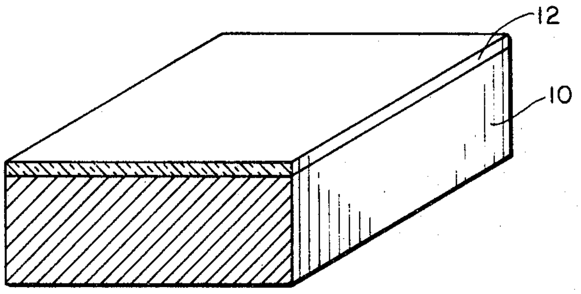

More specifically, an insulated gate field effect device is made by first forming a thermal oxide layer of about 5,000 to 10,000 angstroms in thickness onto one surface of a first-type conductivity silicon substrate of (111) surface orientation. In FIGS. 1 and 2 the substrate is shown at 10 and the oxide layer at 12. The thermal oxide layer 12 can be formed by well-known methods as for example, oxidizing the silicon substrate or wafer 10 at about 1,100° C. by processing with wet oxygen for 2½ hours and with dry oxygen for 30 minutes. Forming an oxide layer of about 8,000 angstroms in thickness has been found most suitable in carrying out the method.

Figure 3:
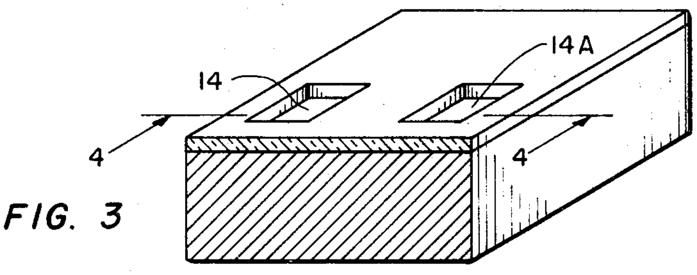

Windows for source and drain electrodes are then etched through the thermal oxide layer. As shown at 14 and 14A in FIG. 3, these windows, for example, can be 100 microns by 100 microns in size and be spaced apart by 8 microns.

The sample is then placed in an epitaxial reactor and vapor etched through the windows 14 and 14A using a hydrogen chloride-hydrogen vapor etch at about 1,150° to 1,225° C. for 2 to 8 minutes wherein the halide mole fraction of the vapor is about 0.14. A temperature of 1,190° C. and a time of 3 minutes has been found most suitably in carrying out the above vapor etch.

Figure 4:
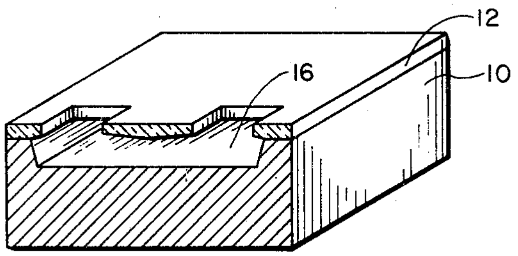

The vapor etching results in an etch depth of about 2 microns and an undercutting between windows, FIG. 4, such that a cavity 16 is developed completely beneath the insulator oxide 12 separating the window regions. This results partially from the fact that there is provided a differential etch rate in both the horizontal and vertical directions. The vapor etching also results in the decomposition and etching into the oxide layer at about one-twentieth of the silicon etch rate.

Figure 5:
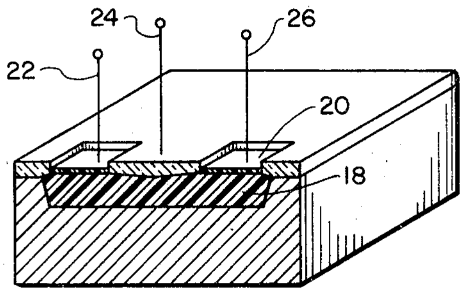

As shown in FIG. 5, silicon of a second-type conductivity as at 18 is then epitaxially regrown into the cavity until the surface of the refill lies in a plane just above the silicon-silicon oxide interface using a hydrogen chloride-hydrogen-silicon tetrachloride-diborane vapor mixture at 1,150° to 1,225° C. for 1 to 4 minutes. A temperature of 1,190° C. and a time of 1½ minutes has been found most suitable in carrying out the above vapor refill. A shallow layer of 0.3 to 0.5 microns in thickness of heavily doped silicon as at 20 of said first conductivity type is then epitaxially regrown into the window area using a hydrogen chloride-hydrogen-silicon tetrachloride-phosphine vapor mixture at about 1,150° to 1,225° C. for about one-half minute. Preferably, in the above step, the temperature is 1,190° C. and the shallow layer 0.5 microns in thickness. The gate insulator oxide is then etched away until its thickness ranges from 0.05 to 0.1 micron using a buffered hydrogen fluoride acid etch. Source 22, gate 24, and drain 26 contacts are then made using conventional metallization and photolith techniques.

Of course, if one starts with a P-type conductivity silicon substrate of (111) surface orientation, an $NP^+$-refill is used with as good results.

It has been found that in the resulting insulated gate field effect device, there is greater electric isolation of the device from the substrate. That is, the P-type refill region can be profiled with impurities $[N_A (X)]$ where $N_A$ is the boron dopant concentration, and $(X)$ is the distance measured from the silicon-silicon oxide interface, in any manner as for example, high resistivity near the substrate for low capacitance and low DC leakage electrical coupling. Similarly, higher breakdown voltages from P-region to substrate are achieved due to low $N_A$ levels near the surface. That is, refill does not give $N_A$ increasing towards the surface such as is inherent in diffused technology. Then too, the variable $N_A (X)$ permits close control of doping in the channel for improved depletion-accumulation mode devices. Moreover, undesirable impurity pileup and depletion effects occurring during thermal oxidation are eliminated.

When an insulated gate field effect device is made according to the method of this invention, it is found that the breakdown voltage from P-region to substrate is increased twofold over the breakdown voltage of an insulated gate field effect device made by a diffusion process. Similarly, when the said device is made according to the method of the invention, the capacitive coupling is decreased twofold below the capacitive coupling of said device as made by a diffusion process. Furthermore, an insulated gate field effect device can be made according to the invention in half the time that the device can be made according to a diffusion process and at half the cost.

We wish it to be understood that we do not desire to be limited to the exact details of construction shown and described, for obvious modifications will occur to a person skilled in the art.

What is claimed is:

1. Method of making an insulated gate field effect device including the steps of A. growing a thermal oxide layer of about 5,000 to 10,000 angstroms in thickness onto one surface of a first-type conductivity silicon substrate of (111) surface orientation, B. etching windows for source and drain electrodes through the thermal oxide layer, C. vapor etching through the windows using a hydrogen chloride-hydrogen vapor etch at 1,150° to 1,225° C. for 2 to 8 minutes wherein the halide mole fraction of the vapor is about 0.14, said vapor etching resulting in an etch depth of about 2 microns and in an undercutting between windows such that a cavity is developed completely beneath the insulator separating the window regions; said vapor etching also resulting in the decomposition and etching of the oxide layer at about one-twentieth of the silicon etch rate, D. epitaxially regrowing silicon of a second conductivity type within said cavity until the surface of the refill lies in a plane just above the silicon-silicon oxide interface, using a hydrogen chloride-hydrogen-silicon tetrachloride-diborane vapor mixture at 1,150° to 1,225° C. for 1 to 4 minutes, E. epitaxially regrowing a shallow layer of 0.3 to 0.5 microns in thickness of heavily doped silicon of said first conductivity type into the window area using a hydrogen chloride-hydrogen-silicon tetrachloride-phosphine vapor mixture at 1,150° to 1,225° C. for about one-half minute, F. etching away the gate insulator oxide until its thickness ranges from 0.05 to 0.1 micron, using a buffered hydrogen fluoride acid etch, and G. making metal gate, source, and drain contacts using conventional metallization and photolith techniques.

2. Method according to claim 1 wherein: in step (A) the thermal oxide layer is about 8,000 angstroms in thickness, in step (C) the temperature is about 1,190° C. and the time is about 3 minutes, in step (D) the temperature is about 1,190 ° C. and the time is about 1½ minutes, and in step (E) the temperature is about 1,190° C.

3. Method according to claim 1 wherein said first-type conductivity silicon is N-type and said second-type conductivity silicon is P-type.

4. Method according to claim 2 wherein said first-type conductivity silicon is N-type and said second-type conductivity silicon is P-type

5. Method according to claim 1 wherein said first-type conductivity silicon is P-type and said second-type conductivity silicon is N-type.

6. Method according to claim 2 wherein said first-type conductivity silicon is P-type and said second-type conductivity silicon is N-type.

7. Method according to claim 1 wherein said windows are 100 microns by 100 microns and are spaced apart by 8 microns.

8. Method according to claim 2 wherein said windows are 100 microns by 100 microns and are spaced apart by 8 microns.

* * * * *